(12) United States Patent
Rubin et al.

(10) Patent No.: US 8,871,528 B2
(45) Date of Patent: Oct. 28, 2014

(54) MEDIUM PATTERNING METHOD AND ASSOCIATED APPARATUS

(75) Inventors: Kurt A. Rubin, San Jose, CA (US); Dan S. Kercher, Santa Cruz, CA (US)

(73) Assignee: HGST Netherlands B.V., Amsterdam (NL)

( * ) Notice: Subject to any disclaimer, the term of this patent is extended or adjusted under 35 U.S.C. 154(b) by 106 days.

(21) Appl. No.: 13/250,885

(22) Filed: Sep. 30, 2011

(65) Prior Publication Data
US 2013/0084653 A1 Apr. 4, 2013

(51) Int. Cl.
H01L 43/12 (2006.01)
G11B 5/855 (2006.01)
H01L 21/266 (2006.01)
G11B 5/74 (2006.01)

(52) U.S. Cl.
CPC ............... *H01L 43/12* (2013.01); *G11B 5/855* (2013.01); *H01L 21/266* (2013.01); *G11B 5/746* (2013.01)
USPC ............................................. 438/3; 438/710

(58) Field of Classification Search
USPC ....................................... 438/3; 257/E43.006
See application file for complete search history.

(56) References Cited

U.S. PATENT DOCUMENTS

| | | | |
|---|---|---|---|
| 6,331,364 B1 | 12/2001 | Baglin et al. | |
| 6,433,964 B1 * | 8/2002 | Chang | 360/133 |
| 6,858,118 B2 | 2/2005 | Platzgummer et al. | |
| 6,864,144 B2 * | 3/2005 | Kenyon et al. | 438/302 |
| 6,998,350 B2 | 2/2006 | Nakazawa et al. | |
| 7,309,630 B2 * | 12/2007 | Fan et al. | 438/257 |
| 7,932,101 B2 * | 4/2011 | Lung | 438/3 |
| 7,967,993 B2 * | 6/2011 | Isowaki et al. | 216/22 |
| 7,972,523 B2 * | 7/2011 | Kimura et al. | 216/22 |
| 8,242,005 B1 * | 8/2012 | Ricci | 438/519 |
| 8,394,723 B2 * | 3/2013 | Valdivia et al. | 438/710 |
| 2005/0287307 A1 | 12/2005 | Singh et al. | |
| 2006/0222967 A1 * | 10/2006 | Okino et al. | 430/5 |
| 2009/0117409 A1 | 5/2009 | Lee et al. | |
| 2009/0123660 A1 | 5/2009 | Inaba et al. | |
| 2009/0199768 A1 | 8/2009 | Verhaverbeke et al. | |
| 2009/0213497 A1 | 8/2009 | Ono et al. | |
| 2010/0053813 A1 | 3/2010 | Fukushima et al. | |
| 2011/0056908 A1 | 3/2011 | Fukushima et al. | |

FOREIGN PATENT DOCUMENTS

DE 211885 A 7/1984
JP 55151643 A 11/1980

OTHER PUBLICATIONS

Fassbender et al., Tailoring Magnetism by Light-ion Irradiation, Journal of Physics D: Applied Physics; Jul. 28, 2004, IOP Publishing Ltd.
Pelletier et al., Plasma-Based Ion Implantation and Deposition: A Review of Physics, Technology, and Applications, IEEE Transactions on Plasma Science, vol. 33, No. 6, Dec. 2005.
Edited by Anders, Handbook of Plasma Immersion Ion Implantation and Deposition, John Wiley & Sons, Inc., 2000.

* cited by examiner

*Primary Examiner* — Damian A Hillman
(74) *Attorney, Agent, or Firm* — Kunzler Law Group, PC

(57) ABSTRACT

According to one embodiment, a method for patterning a medium having a patterned hard mask applied thereon is disclosed herein. The patterned hard mark includes a plurality of apertures exposing portions of the medium. The method includes directing ions toward the medium, implanting a portion of the ions into the exposed portions of the medium, removing a layer of the patterned hard mask with another portion of the ions, and depositing hard mask material onto the patterned hard mask. Depositing hard mask material onto the exposed portions of the medium may follow implantation of the portion of the ions into the exposed portions of the medium.

26 Claims, 7 Drawing Sheets

MEDIUM PATTERNING METHOD AND ASSOCIATED APPARATUS

FIELD

This disclosure relates to patterning features in a medium, and more specifically to reducing mask layer depletion associated with a medium patterning process.

BACKGROUND

Patterning media is used in a variety of technologies for providing storage of data, processing, and other functionality to electronic and magnetic devices. Patterning techniques are employed to spatially define features having different electrical or magnetic properties. Moreover, patterning techniques are used as part of the fabrication process for building a wide variety of semiconductor and magnetic devices.

Patterned features in magnetic media are used for storing digital data that can be erased and rewritten. Patterned magnetic media is used in memory devices, such as MRAM and magnetic logic, and is being developed for use in storage devices, such as disk or tape drives. Patterned magnetic media on a disk or tape substrate can be referred to as bit-patterned magnetic media. In patterned magnetic media for storage devices, some of the patterned features are designed as storage elements of digital bits of data and other patterned features are designed for functions, such as providing servo information to position a read/write head.

Several techniques are known for patterning bit-patterned magnetic media. Prior techniques relied on an etching process for forming the patterns of storage elements in data storage media. However, such techniques required the planarization of the etched disk, which can result in increased cost and labor, as well as a reduction in yield. Accordingly, recently there has been a desire to develop certain techniques to mitigate the shortcomings of etching-based processes. For example, masked ion-beam and masked plasma immersion ion implantation lithography has proven to be an efficient alternative for producing patterned media.

One masked ion-beam lithography approach for relatively low areal density patterned media employs a stencil mask for defining the pattern on a medium (e.g., a resist-covered semiconductor wafer). The stencil mask is made of a silicon wafer placed in an elevated position above the medium. The wafer includes a series of openings corresponding to the desired pattern to be formed on the medium. A lithography beam made of energetic ions traverses through the openings of the stencil mask and is incident onto the medium to transfer the stencil pattern to the medium.

Another masked ion-beam lithography approach for relatively high areal density patterned media utilizes a hard mask applied to a medium (e.g., a semi-conductor wafer or a magnetic storage disk). A pattern, including a series of openings, is formed in the hard mask using known etching techniques. Once the pattern is formed, a beam of energetic ions is directed through the openings in the hard mask onto an exposed layer of the medium. The energetic ions impacting the medium alter the properties of the exposed layer to form a series of patterns in the medium corresponding to the pattern of the hard mask. The patterns can have a variety of sizes and shapes.

Similar to ion-beam lithography, plasma immersion ion implantation techniques form energetic ions which traverse through openings in a hard mask applied on a medium to be patterned. However, unlike ion-beam lithography, plasma techniques form the energetic ion species via a plasma medium as opposed to a directed ion beam.

Masked ion implantation techniques introduce a substantial amount of energetic ions onto the patterned mask. Based on the ion species used, the energetic ions tend to erode or sputter-etch the mask, which results in a reduction in the thickness of the mask. One negative consequence of reducing the thickness of the mask is that at a certain thickness, the mask fails to effectively block or stop the energetic ions. Unblocked energetic ions passing through the mask impact the medium at undesirable locations to negatively alter the intended pattern on the medium and render the medium unusable. Exacerbating this shortcoming is the push to extend the resolution of the ion implant process to enable higher areal densities, particularly with patterned magnetic media, by reducing the lateral straggle of the ion species used for implantation. The most promising approach for reducing lateral straggle is to increase the mass of the energetic ion species. However, such higher mass ion species tend to sputter etch the mask at a higher rate for a given ion dosage, which results in a higher rate of mask thickness reduction.

Further, the trending of increased areal density of, and the corresponding reduction in size of, storage elements or features on a medium demands that mask thickness be designed with smaller thickness to accommodate the correspondingly increased density of bit patterns on the mask. Therefore, to achieve higher areal densities, the erosion of masks due to ion sputtering must be carefully and precisely controlled.

Similar to patterned magnetic media, electronic devices, such as semiconductor devices, utilize ion implantation techniques for forming a pattern of doped regions in a medium exposed to energetic ions via apertures formed in a hard mask applied to the medium. The implanted ions cause the electrical properties of the doped regions in the medium to change from an initial value of the medium (e.g., semiconductor medium), thereby leaving un-doped regions covered by the hard mask between the doped regions.

In the past, when electrical devices were large in size and doping densities were low, building hard masks that were adequately robust to hold up against etching by the energetic ions was fairly straightforward. However, as the number of devices on a chip has increased, the characteristic sizes of the devices have correspondingly decreased, both laterally and in thickness. Correspondingly, the thickness and distances between adjacent apertures of the hard mask have been constrained to be reduced, which results in a reduction in the mechanical strength of the mask. Moreover, as electrical devices on a chip become thinner, the ion implantation depth is decreased to efficiently implant the ions substantially within the target medium thickness. Accordingly, the energy of the implanting ions must be adjusted so they stop within the thickness of the media. Generally, adjustment of the energy of the implanting ions is accomplished by lowering the energy of the implanting ions. However, one undesired byproduct of lowering the energy of the implanting ions is that the sputter yield of the implanting ions increases, which tends to increase the erosion of the hard mask for a given number of implanting ions. Further, because recently developed ion implantation tools have helped facilitate an increase in implant current density, building devices with relatively high implant dosages (e.g. $10^{15} \sim 10^{16}$ ions/cm$^2$) is now possible. But, the higher the implant dosages, the greater the undesired erosion of the hard mask. Thus, as electronic devices, such as semiconductor devices, shrink in size, it will be necessary to employ thinner hard masks that adequately stop a larger number of ions generating a higher number of sputtered mask atoms.

Current ion implantation techniques for forming patterned media fail to adequately control the erosion of patterned masks. For example, some techniques reinforce the mask with a coating prior to the ion implantation process. However, the coating can still be eroded with use of some ion species. Some stencil mask techniques attempt to compensate for energetic ion-caused sputtering of the mask by depositing material to the mask and subsequently sputtering the newly deposited material. The subsequent sputtering is required to reduce deviations from homogeneity necessarily present in the deposited material. Without the subsequent sputtering step, the newly deposited material would not be homogenous, which can reduce the effectiveness of the stencil mask. Accordingly, not only is this deposition and sputtering technique limited to ion implantation processes that use stencil masks, as opposed to hard mask coatings, but it requires an additional sputtering step, which increases manufacturing costs and time. Additionally, because ion implantation processes using stencil masks are limited to low areal density samples, no known techniques are available for compensating for the energetic ion-caused erosion of hard masks in the production of high areal density samples.

SUMMARY

The subject matter of the present application has been developed in response to the present state of the art, and in particular, in response to the problems and needs in the art that have not yet been fully solved by currently available medium patterning systems. Accordingly, the subject matter of the present application has been developed to provide a medium patterning method, and associated apparatus, for patterning a medium that overcomes at least some shortcomings of the prior art medium patterning systems. For example, the medium patterning system of the present application addresses mask layer depletion by replenishing the mask layer during or sequentially between ion implantation procedures. The mask layer in the described embodiments is a hard mask applied to or coated on the medium. In other words, the system for replenishing the mask layer described herein is preferably applicable to replenishing a hard mask, as opposed to a stencil mask. However, the same principles may apply to photoresist masks applied directed onto a medium. Therefore, because hard mask processes for patterning media as defined herein are fundamentally different than stencil mask processes as discussed above, known techniques that compensate for ion-caused sputtering of mask material from a stencil mask during an ion implantation process are not applicable to the present medium patterning system.

According to one embodiment, a method for patterning a medium having a patterned hard mask applied thereon is disclosed herein. The patterned hard mark includes a plurality of apertures exposing portions of the medium. The method includes directing ions toward the medium, implanting a portion of the ions into the exposed portions of the medium, removing a layer of the patterned hard mask with another portion of the ions, and depositing hard mask material onto the patterned hard mask. Depositing hard mask material onto the exposed portions of the medium may follow implantation of the portion of the ions into the exposed portions of the medium. The method may also include directing hard mask material toward the medium such that depositing hard mask material onto the patterned hard mask includes depositing a first portion of the directed hard mask material onto the patterned hard mask. Further, depositing hard mask material onto the exposed portions of the medium may include depositing a second portion of the directed hard mask material onto the exposed portions of the medium.

In certain implementations, the hard mask material is deposited at an acute angle relative to an outer surface of the patterned hard mask onto which the hard mask material is deposited. The plurality of apertures is defined by a plurality of sidewalls formed in the patterned hard mask. Depositing hard mask material onto the patterned hard mask includes depositing a layer of hard mask material onto a top surface of the patterned hard mask and a portion of the sidewalls defining the plurality of apertures. The acute angle can be between thirty and eighty degrees, and in some implementations, between sixty and eighty degrees. Further, the hard mask material can be a high-density carbon. Generally, carbon has a sputter erosion rate that is lower than many other materials (e.g., carbon can be deposited with a sputtering yield that is lower than any other material).

According to some implementations, the medium includes a magnetic layer and the implanted ions alter the magnetic properties of the exposed portions of the magnetic layer to form a plurality of non-magnetic regions corresponding with the plurality of apertures of the patterned hard mask. Directing ions toward the medium can include directing an ion-beam toward the medium and the method can include laterally moving the medium relative to the ion-beam while implanting the portion of the ions into the exposed portions of the medium. In some implementations, the method includes rotating the medium while depositing the hard mask material onto the patterned hard mask. According to certain implementations, the magnetic layer may be taken to mean a set of layers which have different magnetic properties. For example, in one implementation, the magnetic layer may be coated with a non-magnetic coating such that the incident ions penetrate thru the non-magnetic coating to affect the magnetic layer. In another implementation, there may be two magnetic layers which are separated by a non-magnetic layer. In such an implementation, the energy of the ions would be selected to penetrate the top magnetic layer, but be mostly stopped in the non-magnetic layer before reaching the bottom magnetic layer. All of the above-mentioned magnetic and/or non-magnetic layers may be on top of a substrate.

In some implementations, directing ions toward the medium, implanting the portion of the ions into the medium, removing the layer of the patterned hard mask, and depositing hard mask material onto the patterned hard mask occur concurrently. In other implementations, depositing hard mask material onto the patterned hard mask occurs after removal of the layer of the patterned hard mask.

Directing ions toward the medium can be achieved with exposure to a first plasma. Further, depositing hard mask material onto the patterned hard mask can include exposing the medium to a second plasma or plasma deposition source. The plasma deposition source includes species that can be used to create the hard mask material. In certain implementations, the first plasma and second plasma may include the same plasma medium with the first plasma having ion species mixed with the plasma medium and the second plasma having mask material species mixed with the plasma medium. In other implementations, the first and second plasmas have different plasma media. The ions of the first plasma may be a first species of ions and the first plasma may be a high-voltage plasma defined as a plasma with a relatively high acceleration voltage (e.g., typically greater than 1,000V). In contrast, the hard mask material may be a second species and the second plasma may be a low-voltage plasma defined as plasma with a relatively low acceleration voltage (e.g., typically lower than 100V). The first species can be substantially the same as the second species. Alternatively, the first species can be different than the second species.

In certain implementations, the magnetic layer and the hard mask are formed on a substantially cylindrical substrate. In yet some implementations, the magnetic layer and the hard mask are formed on a flexible tape substrate. According to some implementations, the medium is a magnetic medium of a magnetic memory device. The magnetic memory device can be a magnetoresistive random access memory (MRAM) device.

According to some implementations, the medium has an initial set of electrical properties. The implanted ions alter the electrical properties of the exposed portions of the medium to form a plurality of regions with different electrical properties corresponding with the plurality of apertures of the patterned hard mask. The electrical properties of the medium can be different in unexposed portions and the exposed portions of the medium following implanting of the portion of the ions into the exposed portions of the medium. The medium can be made from a semiconductor material.

According to another embodiment, an apparatus for patterning a medium having a patterned hard mask applied thereon is disclosed herein. The patterned hard mask includes a plurality of apertures exposing portions of the medium. The apparatus includes a sealed chamber, a platen configured to support at least one medium within the sealed chamber, and an ion source communicable in ion providing communication with the sealed chamber. A first portion of the ions are implanted into the exposed portions of the medium and a second portion of the ions etch away a top portion of the patterned hard mask. The apparatus also includes a hard mask material source communicable in hard mask material providing communication with the sealed chamber. At least a portion of the provided hard mask material is deposited onto the at least one medium on the platen to substantially replace the top portion etched away from the patterned hard mask.

In some implementations, the sealed chamber includes a first sub-chamber and a second sub-chamber. The first sub-chamber is partitioned from the second sub-chamber by a gate that is movable between open and closed positions. The platen is movable between the first and second sub-chambers when the gate is in the open position. The ion source is communicable in ion radiating communication only with the first sub-chamber and the hard mask material source is communicable in hard mask material providing communication only with the second sub-chamber.

According to certain implementations, the apparatus is operable in an implantation mode in which the ion source is in ion providing communication with the sealed chamber and a deposition mode in which the hard mask material source is in hard mask material providing communication with the sealed chamber. For a given medium, the apparatus switches from operation in the implantation mode to operation in the deposition mode at least twice. The platen can be movable relative to the ion source and hard mask material source.

Disclosed herein is another embodiment of a method for patterning features in a magnetic layer on a medium where the features have different magnetic properties than the magnetic layer. The magnetic layer is coated with a patterned hard mask having a plurality of apertures that expose portions of the magnetic layer. The method includes exposing the patterned hard mask and magnetic layer to energetic ions such that a first portion of the ions are implanted into the exposed portions of the magnetic layer to render the exposed portions less magnetic, and a second portion of ions etch remove a top layer of the patterned hard mask. The method further includes depositing a hard mask material onto the patterned hard mask to replace the etch removed top layer of the patterned hard mask. Exposing the patterned hard mask and magnetic layer to energetic ions can occur in a first chamber, and depositing the hard mask material onto the patterned hard mask can occur in a second chamber separate from the first chamber.

In some implementations, exposing the patterned hard mask and magnetic layer to ions includes a first step of exposing the patterned hard mask and magnetic layer to ions. Depositing a hard mask material onto the patterned hard mask to replace the etch removed top layer of the patterned hard mask may include a first step of depositing a hard mask material onto the patterned hard mask. The method may further include a second step of exposing the patterned hard mask and magnetic layer to ions following the first step of exposing the patterned hard mask and magnetic layer to ions and the first step of depositing a hard mask material onto the patterned hard mask. Additionally, the method may include a second step of depositing a hard mask material onto the patterned hard mask to replace at least some of the deposited hard mask material etched removed by the second step of exposing the patterned hard mask and magnetic layer to energetic ions.

Reference throughout this specification to features, advantages, or similar language does not imply that all of the features and advantages that may be realized with the subject matter of the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Figure 1:
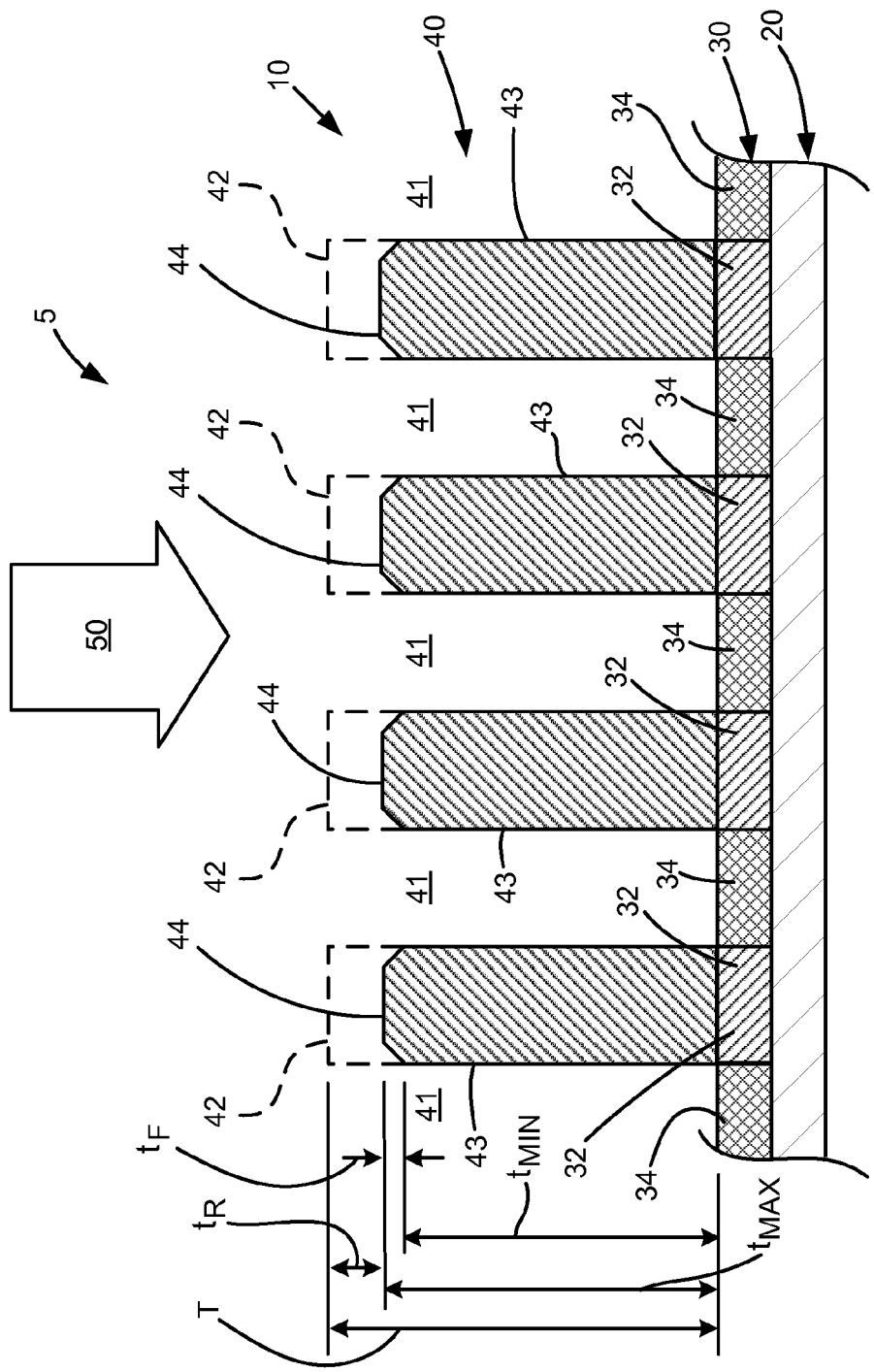
FIG. 1 is a schematic cross-sectional illustration of one embodiment of an apparatus for patterning a patterned magnetic medium showing an ion implantation and etching operation of the apparatus.

According to FIG. 1, an apparatus 5 for patterning a patterned magnetic medium 10 is shown. The patterned magnetic medium 10 can be a component of a magnetic memory device, such as a hard disk drive, magnetoresistive random access memory (MRAM) device, and the like. For a hard disk drive, the component may be a media. As shown, the patterned magnetic medium 10 includes a substrate 20 and a magnetic layer 30. The magnetic layer 30 is applied to (e.g., coated on) the substrate 20.

The substrate 20 can be made from any of various electrically insulated or non-conductive materials, such as, for example aluminum, aluminum alloys, polymers, paper, glass, glass composites, magnesium alloys, ceramics, silicon, silicon wafers coated with one or more material layers, or other materials commonly used in the art. The substrate may be coated with other layers that are present below the layer to be affected by the ions. For example the substrate may be aluminum with a NiP coating. In certain implementations, the substrate 20 is a flexible tape substrate. In other implementations, the substrate 20 is a hard disk substrate.

The magnetic layer 30 is a relatively thin film made from a magnetic material, such as, for example, any of various ferromagnetic materials, iron, cobalt, cobalt, chromium, platinum, palladium, nickel, alloys of the same (e.g., alloys including oxygen, boron, silicon, carbon, and the like), or other materials commonly used in the art.

The medium 10 further includes a patterned hard mask layer 40 applied to (e.g., coated on) the magnetic layer 30 using common techniques known in the art.

In certain implementations, the substrate 20 is a substantially cylindrically-shaped (i.e., circular in cross-section) and relatively thin substrate. Accordingly, in such implementations, the magnetic layer and the hard mask also are substantially cylindrically-shaped. In yet other implementations, the substrate, magnetic layer, and hard mask have a cross-sectional shape that is substantially non-circular, such as for example, rectangular (e.g., magnetic tape) and the like.

The patterned hard mask 40 includes a plurality of apertures 41 extending a total thickness T of the mask to expose portions 34 of the magnetic layer 30. The apertures 41 are defined between or adjacent mask elements 43. Each mask element 43 can be substantially elongated in a vertical direction, and have any of various cross-sectional shapes, such as circular, ovular, rectangular, and the like. The exposed or uncovered portions 34 of the magnetic layer 30 define therebetween a plurality of covered portions 32 of the magnetic layer. Each covered portion 32 is covered by a respective mask element 43 of the hard mask 40. The apertures 41 form part of a predetermined pattern associated with a desired pattern of magnetic bits in the magnetic layer 30. In certain implementations, the patterned hard mask 40 is configured to form magnetic bits or features in the magnetic layer 30 each having a size smaller than approximately 30 nm (e.g., between about 10 nm and about 30 nm) and in some implementations, smaller than 10 nm. The size of the bits may be different in different directions relative to the plane of the sample.

The patterned hard mask 40 can be made from any of various materials, such as, for example, carbon, amorphous carbon, diamond-like carbon, carbon nitride, silicon, polymers, imprint resist, metals, or other materials commonly used in the art for forming a hard mask. In certain applications, such as for patterning non-magnetic media, such as semiconductors, the patterned hard mask 40 can be replaced with a patterned photoresist mask made from, for example, a polymer. However, polymer photoresist masks applied using a spin-coat or imprint lithography technique may tend to erode at a higher rate compared to thin-film carbon masks deposited by, for example, a vacuum technique (e.g., sputtering, chemical vapor deposition, and the like).

The process for forming magnetic bit patterns in the magnetic layer 30 includes directing (e.g., radiating) a plurality of energetic ions 50 towards the medium 10. As shown, the ions 50 are directed toward the magnetic layer 30 and depleted hard mask 40 at a substantially normal incident angle relative to upward facing surfaces 36, 44 of the magnetic layer and hard mask, respectively. A portion of the ions 50 contact and are stopped by the hard mask 40. The remaining portion of the ions 50 pass through the apertures 41 and impact the exposed portions 34 of the magnetic layer 30. The size and energy of the ions 50 allows the ions to embed within the exposed portions 34. The embedded or implanted ions 50 alter the magnetic properties of the exposed portions 34 of the magnetic layer 30. Generally, the implanted ions 50 act to demagnetize the exposed portions 34 or render the exposed portions less magnetic. Because the covered portions 32 of the magnetic layer 30 are covered by the hard mask 40 (i.e., the mask elements 43), the ions 50 are not embedded in the covered portions. Accordingly, the covered portions 32 retain their magnetic properties and remain magnetized. In this manner, the ionization of the patterned exposed portions 34 of the magnetic layer 30 form a patterned series of magnetic bits 32 in the magnetic layer. After the magnetic bits 32 are formed, the hard mask 40 is subject to a chemical process known in the art to remove the hard mask from the medium 10 to expose the entire magnetic layer 30.

The ions 50 can be made up of any of various types of ion species, such as, for example, antimony, nitrogen, oxygen, chromium, neon, argon, fluorine, boron, phosphorus, tungsten, arsenic, hydrogen, helium, carbon, silicon, and the like. In certain implementations, and to reduce lateral straggle of the implant species within the magnetic layer, the ions 50 are made up of higher mass implant species, such as, for example, high-density antimony, arsenic, germanium, bismuth, krypton, xenon, and the like.

After implanting ions into the non-magnetic portions of a magnetic layer, additional processes may be performed to further implant the ions or secure/lock the implanted ions within the magnetic layer. For example, any of various additional steps known in the art, such as, for example, a flash anneal process, thermal anneal process, furnace process, and the like.

The ion implantation process for forming magnetic bits 32 in the magnetic layer 30 also has the effect of etching or removing a top layer 42 from the hard mask 40. As ions 50 impact the hard mask 40, the energy of the ions causes portions of the hard mask to be removed (e.g., stripped) via an etching process. Because the removed portions 42 of the hard mask 40 are generally uniform across flat regions of the mask, the removed portions can be defined as a removed layer of the hard mask having a thickness $t_R$. However, the amount of material etched from the upper corners of the hard mask elements 43 will generally be greater due to faceting of the corners. Therefore, an additional amount of removed material at the corners of the elements 43 denoted as $t_F$ should be accounted for. Following the etching process, the remaining hard mask 40 has a minimum thickness $t_{MIN}$ and a maximum thickness $t_{MAX}$. The minimum thickness $t_{MIN}$ is equal to the initial thickness T of an element 43 minus the thickness $t_R$ and thickness $t_F$. The maximum thickness $t_{MAX}$ is equal to the initial thickness T of an element 43 minus just the thickness $t_R$. Accordingly, prior to the ion implantation process, the hard mask 40 has an initial thickness T equal to the minimum thickness $t_{MIN}$ plus the removed corner thickness $t_F$ due to faceting and removed flat layer 42 thickness $t_R$.

After etching, once the thickness of the remaining hard mask 30 decreases below a predetermined thickness threshold associated with the given ion species and intensity, the hard mask may no longer effectively function as a protection for the magnetic layer 30 and ions may undesirably start to penetrate the hard mask 40 and implant in the covered portions 32 of the magnetic layer. Accordingly, for proper formation of the patterned magnetic medium 10, the remaining thickness of the hard mask 30 should not fall below the predetermined thickness threshold for the particular hard mask and ions being used in the patterning process. The predetermined thickness threshold can correspond with one or both of the minimum thickness $t_{MIN}$ and maximum thickness $t_{MAX}$ depending on the application. For example, in some implementations, once the minimum thickness $t_{MIN}$ falls below a first predetermined threshold and/or the maximum thickness $t_{MAX}$ falls below a second predetermined threshold, which is greater than the first predetermined threshold, the hard mask may no longer effectively function as a protection for the magnetic layer 30.

As discussed above, some conventional processes increase the total or initial thickness T of the hard mask to compensate for lost material during the ion implantation step. However, thicker hard masks are not conducive for forming patterned magnetic media with relatively high areal densities. For this reason, recent conventional processes for forming patterned magnetic media with higher areal densities use hard masks with relatively small thicknesses. But, the transition to thinner hard masks increases the likelihood of reducing the thickness of the hard mask to below the predetermined minimum thickness.

Figure 2:
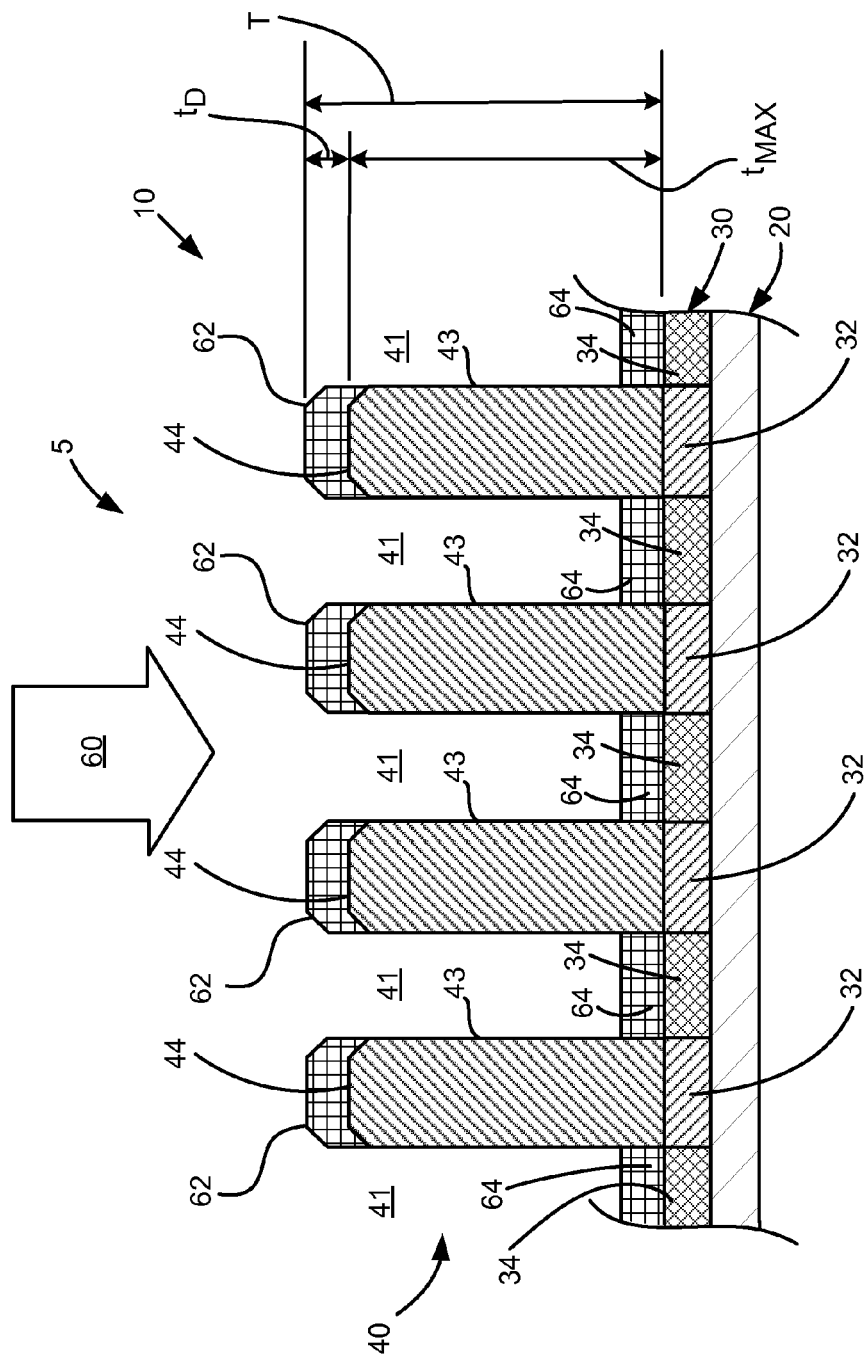
FIG. 2 is a schematic cross-sectional illustration of the apparatus of FIG. 1 showing a new mask material deposition operation of the apparatus.

Accordingly, referring to FIG. 2, the apparatus 5 facilitates a process that compensates for the etched removal of the hard mask 40, and maintains the minimum and maximum thicknesses $t_{MIN}$, $t_{MAX}$ above the corresponding thresholds, by depositing a layer of new mask material 60 onto the hard mask to effectively replace the removed layer of hard mask and maintain the total or initial thickness T of the hard mask. Following the ion implantation process depicted in FIG. 1, a stream or flow of new mask material 60 (i.e., species that can be used to create a new mask material) is directed toward the medium 10 and depleted hard mask 40. As shown, the new mask material 60 is directed toward the magnetic layer 30 and depleted hard mask 40 at a substantially normal angle (e.g., zero incidence angle β (see FIG. 3)) relative to the upward facing surfaces 36, 44 of the magnetic layer and hard mask, respectively. Due to the substantially normal angle (e.g., zero incidence angle) of the stream of new mask material 60, respective portions of the new mask material impacts not only the upward facing surface 44 of the depleted hard mask 40 (or surfaces 44 of the mask elements 43), but also the upward facing surface 36 of the magnetic layer 30. As the new mask material 60 impacts surfaces 36, 44 of the magnetic layer 30 and hard mask 40, the material adheres to (e.g., coats) and accumulates on the surfaces to form a layer of new hard mask material 62, 64 on the hard mask and magnetic layer, respectively. In this manner, the new mask material 64 acts as a protective layer for the magnetic layer 30 to reduce sputtering effects from subsequent ion implantation processes. Generally, the new mask material 64 has a thickness approximately equal to a desired thickness $t_D$ of the material 62 deposited onto the mask elements 43 as discussed immediately below.

The characteristics of the new mask material 60 (e.g., species, mass flow rate, duration, etc.) are controlled to achieve a layer of new mask material 62 with a desired thickness $t_D$. In one implementation, the desired thickness $t_D$ is approximately equal to the thickness $t_R$ of the etched removed layer 42 of the hard mask 40. In this manner, the original total thickness T of the hard mask 40 is maintained for the next round of ion implantation as will be described in more detail below. In other implementations, the desired thickness $t_D$ can be more or less than the thickness $t_R$ of the etched removed layer 42. For example, according to one specific implementation, the desired thickness $t_D$ is less than the thickness $t_R$ of the etched removed layer 42 such that the new total thickness T of the hard mask 40 is reduced compared to the original total thickness of the hard mask. Preferably, however, the desired thickness $t_D$ of the new mask material layer 62 is sufficient such that the new total thickness T of the hard mask 40 does not fall below the minimum required thickness of the hard mask 40 for stopping all ions 50 from impacting the magnetic layer 30 as discussed above.

As discussed above, the desired thickness $t_D$ of the new mask material layer 62 is based at least partially on the thickness $t_R$ of the etched removed layer 42. Accordingly, to determine the characteristics of the new mask material 60, the thickness $t_R$ of the etched removed layer 42 must be determined. In some implementations, the thickness $t_R$ of the etched removed layer 42 is measured by comparing a measured total thickness T of the hard mask 40 before and after an ion implantation process. Alternatively, or additionally, the thickness $t_R$ of the etched removed layer 42 can be estimated based on known characteristics of the energetic ions 50 (e.g., species, mass flow rate, duration, energy, etc.) and the material properties of the hard mask 40.

For ion implantation at substantially normal incident angles, the desired thickness $t_D$ should be small enough that the ions can penetrate the layer 64 of mask material deposited on the magnetic layer 30 and impact the non-magnetic portions 34 in the magnetic layer. Therefore, the characteristics of the new mask material process should be controlled to maintain the desired thickness $t_D$ below a maximum allowable thickness. The maximum allowable thickness can be determined based on the characteristics of the ion application process and the type of new mask material. The new mask material 60 may be the same as or different than the material forming the hard mask 40. In some embodiments, the new mask material 60 can be any of various hard mask species, such as, for example, high-density carbon, carbon containing other species, such as hydrogen or nitrogen, carbon nitride, boron nitride, silicon nitride, and the like.

In certain embodiments, a control module (not shown) may be included that determines (e.g., measures and/or estimates) the amount (e.g., thickness $t_R$) of material removed from the hard mask 40 and the desired thickness $t_D$ based on any of various parameters as described above.

Figure 3:
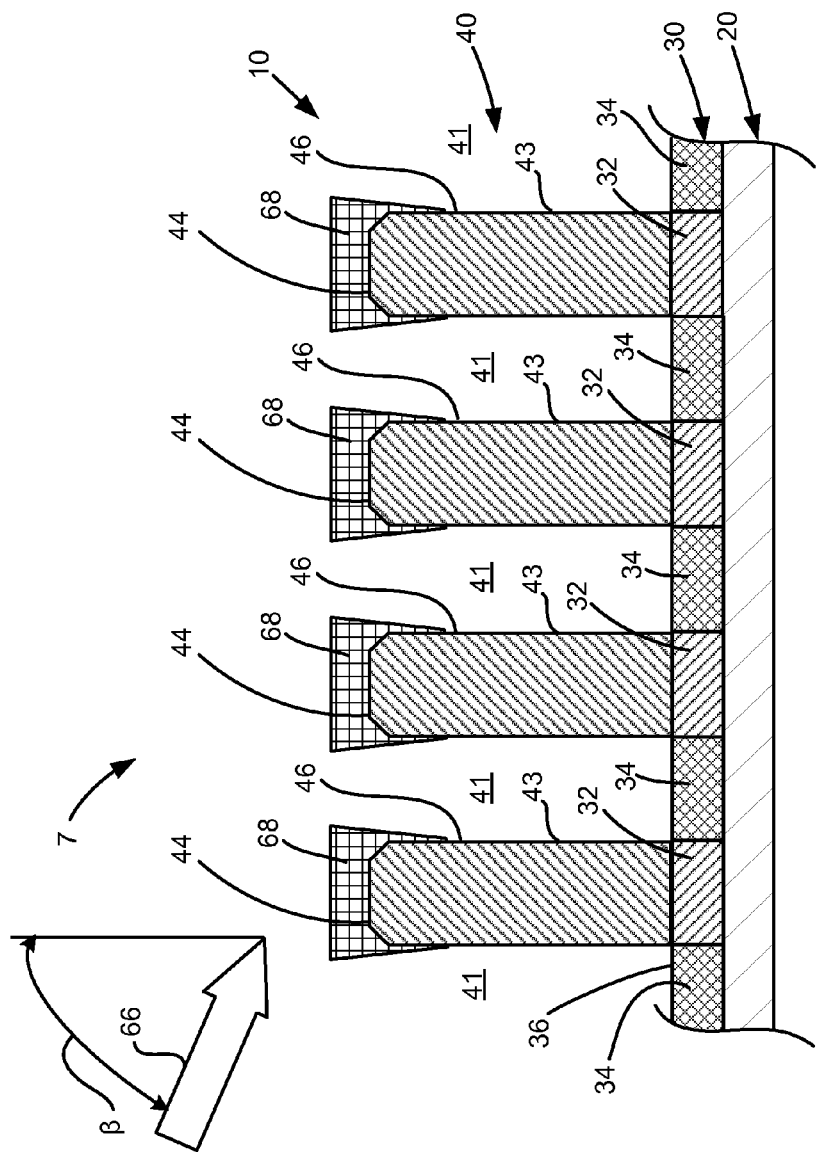
FIG. 3 is a schematic cross-sectional illustration of another embodiment of an apparatus for patterning a patterned magnetic medium showing an angled mask material deposition operation of the apparatus.

Referring to FIG. 3, in certain embodiments, minimizing, and even eliminating, the deposition of new mask material 66 on the surface 36 of the magnetic layer 30 may be desirable. For example, in some applications, even small amounts of new mask material on the magnetic layer 30 may prevent ions from impacting and implanting within the non-magnetic portions of the magnetic layer. As shown, deposition of new mask material 66 on the surface 36 of the magnetic layer 30 may be reduced or eliminated by an apparatus 7 that deposits the new mask material at an incidence angle β relative to a line perpendicular to the surface of the magnetic layer that is less than ninety degrees.

By depositing the new mask material 66 at an acute or shallow angle relative to the upper surface 44 of the mask layer 40 (e.g., a non-shallow angle of incidence β), the new mask material accumulates as layers 68 only on the top surface 44 of the hard mask 40, and depending on the angle, an upper portion of the sidewalls 46 of the mask elements 43 that define the apertures 41. Accordingly, one potential side-effect of depositing new mask material 66 at a non-shallow incidence angle β is that the openings of the apertures 41 may be reduced due to buildup of new mask material 68 on the sidewalls 46 of the mask elements 43. However, the incidence angle β and deposition characteristics can be controlled such that the deposited new mask material layers 68 do not block or close the apertures 41, which maintains the ability of the ions 50 to impact and implant within the magnetic layer 30. Although any of various incidence angles β can be used, in some implementations, the angle β is between about thirty and about eighty degrees. In one specific implementation, the angle is between about sixty and about eighty degrees.

It is noted that the figures of depicting the apparatus of the present application are schematic in nature. According, the schematic depictions of the apparatus are not to be interpreted as literal representations of physical embodiments. Rather, the schematic depictions of the apparatus are to be interpreted as figurative representations of physical embodiments. For example, the sidewalls 46 of the mask elements 43 of an actual mask layer 40 typically are not perfectly vertical and flat (e.g., they may be partially rough). Also, the top surface 44 of an actual mask layer 40 may be rough, as opposed to perfectly flat as indicated in the illustrated representations. Further, in physical embodiments, the corners of the mask elements 43 and new mask material 62, 68 typically will not form sharp angles, but will rather tend to form rounded corners. Moreover, although the widths of the mask elements 43 in the schematic depictions are the same, in other embodiments, the widths of the mask elements are different to define covered portions or features 32 with different widths (e.g., data features may be narrower than servo features). Also, even though the widths of the mask elements 43 appear the same as the widths of the openings 41 in the illustrated embodiments, the widths of the mask elements and openings can be different in other embodiments. Similarly, although the widths of the openings 41 in the schematic depictions are the same, in other embodiments, the widths of the openings can be different in other embodiments.

Although the above-described apparatus and methods are directed to patterning magnetic media, the same apparatus and methods can be applied to patterning non-magnetic media, such as, for example, semiconductor wafers, nano-devices, and the like and without departing from the spirit and essence of the subject matter disclosed herein. In other words, the apparatus and methods of the present disclosure can be applied to the manufacture of any media having small features that require relatively high implant doses. For example, in some embodiments, the medium is made from a semiconductor or similar material that has an initial set of electrical properties. When implanted into the exposed portions of the medium, the ions alter the electrical properties of the exposed portions, leaving unchanged the initial set of electrical properties of the unexposed portions. In this manner, the ion implantation process forms a plurality of regions with different electrical properties than the initial set of electrical properties. The plurality of regions corresponds with the plurality of apertures in a patterned hard mask.

According to one embodiment, a method 400 for patterning a bit-patterned media includes directing ions at a masked medium at 410. The masked medium includes at least one patterned layer, which can be a magnetic layer or another type of patterned layer, such as a patterned layer associated with a non-magnetic medium as described above, and a patterned hard mask applied to the patterned layer. The method 400 further includes at 420 implanting a portion of the ions into the patterned layer at designated portions or domain of the patterned layer (e.g., non-magnetic portions of a magnetic layer). Concurrently with the implantation of ions into the patterned layer, the method 400 includes at 430 removing, such as via etching, a layer of the patterned hard mask with another portion of the ions. The actions 410, 420, 430 may be accomplished according to the ion providing, implantation, and etch removal processes described above in relation to FIG. 1. After the ion implantation and hard mask removal actions 420, 430, the method 400 determines at 440 whether further ion implantation is necessary. If it is determined at 440 that another ion implantation action 420 is not required, then the method 400 ends. However, if it is determined at 440 that another ion implantation action 420 is required, then the method proceeds at 450 to deposit a new hard mask material onto the patterned hard mask. The action 440 may be accomplished according to at least one of the new mask material deposition processes described above in relation to FIGS. 2 and 3.

In certain implementations, the new hard mask material effectively replaces the layer of hard mask removed by the etch removal action 430. Following the completion of the method 400, the hard mask is stripped from the patterned layer using mask stripping techniques known in the art. Additional, pattern post-formation steps can be employed to condition the medium for use, such as, for example, annealing, buffing, polishing, and washing of the medium.

Following deposition of the new hard mask material at 450, the method 400 repeats actions 410, 420, 430 and again performs the determination at 440. The actions 410, 420, 430, and 450 are continuously repeated as long as the determination at 440 is answered affirmatively. Accordingly, by repeatedly replenishing the hard mask with new hard mask material as needed, the method 400 is capable of performing multiple ion implantation steps on a given patterned medium without depleting the effectiveness of the patterned hard mask to stop the ions.

Further, each of the multiple ion implantation steps for forming a patterned layer in a given medium can have the same characteristics. Similarly, each of the multiple ion etching and mask material deposition steps for forming a patterned layer in a given medium can have the same characteristics. Alternatively, in certain implementations, at least one of the multiple ion implantation steps can have different characteristics than another of the multiple ion implantation steps. Likewise, at least one of the multiple ion etching and mask material deposition steps can have different characteristics than another of the multiple etching and deposition steps, respectively. For example, the first of multiple ion implantation steps can implant a first amount of ions into the patterned layer, etch remove a first amount of mask material from the hard mask, and deposit a first amount of new mask material onto the hard mask. Then, if desirable, the second of multiple ion implantation steps can implant a second amount of ions into the patterned layer, etch remove a second amount of mask material from the hard mask, and deposit a second amount of new mask material onto the hard mask, where at least one of the second amount of implanted ions, removed mask material, and deposited mask material is different than the first amount of implanted ions, removed mask material, and deposited mask material, respectively. The thickness and mask composition might change to allow for process optimization that may trade-off penetration depth and resolution associated with straggle using implants of different species and energy, along with controlling the amount of cross-contamination of the implanted region by some of the mask material being driven during the implant process.

The steps of ion implantation/etching as describe above may be completed prior to or concurrently with an associated step of mask material deposition. In one embodiment, the steps of ion implantation/etching and material deposition are performed serially or one after the other. In other words, the material deposition step is not performed until the ion implantation/etching steps are completed. In contrast, according to another embodiment, the steps of ion implantation/etching and material deposition are performed concurrently (e.g., in parallel) to different parts of the medium. For example, a patterned medium (e.g., a magnetic medium) can be moved or swept underneath a simultaneously produced and spaced-apart ion beam (e.g., an ion beam ribbon) and stream of new mask material. Alternatively, the ion beam and new mask material stream can be simultaneously moved over the patterned medium.

Figure 4:
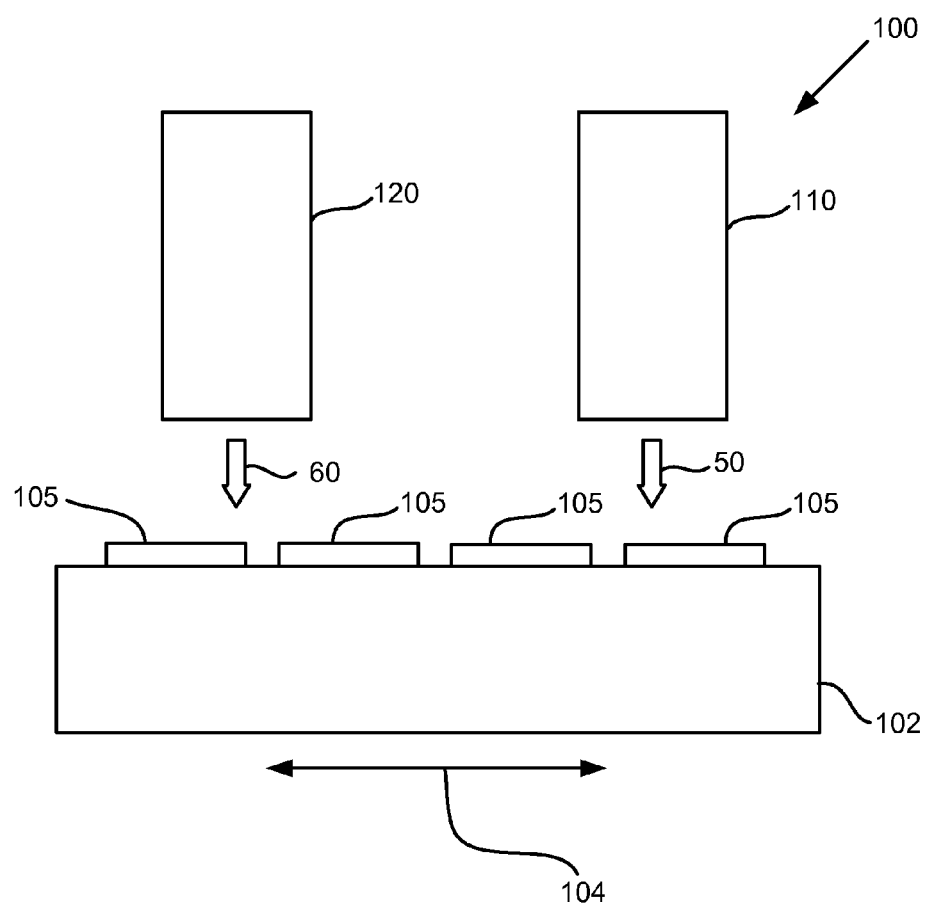
FIG. 4 is a schematic illustration of one embodiment of an apparatus for patterning patterned media.

Referring to FIG. 4, one embodiment of an apparatus 100 for patterning patterned media 105 having a patterned layer is shown. The apparatus 100 is configurable to implant ions in the patterned media 105 and deposit new mask material onto the media in serial or parallel steps as discussed above. The patterned media 105 may include a substrate on which a patterned layer is positioned or applied. As discussed above, the patterned layer of the patterned media 105 can be a patterned magnetic layer such as illustrated in FIGS. 1-3, or any other type of patterned media having one or more patterned layers, such as semiconductor wafers, nano-devices, and the like, as discussed above. The apparatus 100 includes a platen 102 for supporting one or more media 105. As shown, the platen 102 supports a plurality of patterned media 105. The platen 102 is movable as indicated by directional arrow 104. In certain implementations, the platen 102 is movable laterally, and in other implementations, the platen is movable laterally and/or rotationally. A drive mechanism commonly known in the art can be employed for moving the platen 102. In the illustrated embodiment, the platen 102 is movable relative to at least one ion source 110 and at least one new mask material source 120. However, in certain implementations, the platen 102 can be stationary and the ion and mask material sources 110, 120 may be movable relative to the platen.

The ion and new mask material sources 110, 120 are configured to produce and direct ions 50 and new mask material 60, respectively, at the patterned media 105 on the platen 102. As described above, the ion and new mask material sources 110, 120 may produce and direct ions 50 and new mask material 60, respectively, concurrently or consecutively. The apparatus 100 may be positioned within or be coupled to a sealed chamber (not shown) to prevent contaminants and foreign particles from negatively affecting the patterning process. For example, in some implementations, the ion source 120 is positioned outside of the sealed chamber, but may include an ion expelling nozzle that is coupled to the chamber through an opening in the chamber. Similarly, the new mask material source 120 may be positioned outside of the sealed chamber, but may include a mask material expelling nozzle that is coupled to the chamber through another opening in the chamber. Alternatively, the ion and mask material sources 110, 120 may be positioned within the chamber along with the platen 102 and media 105.

Figure 5:
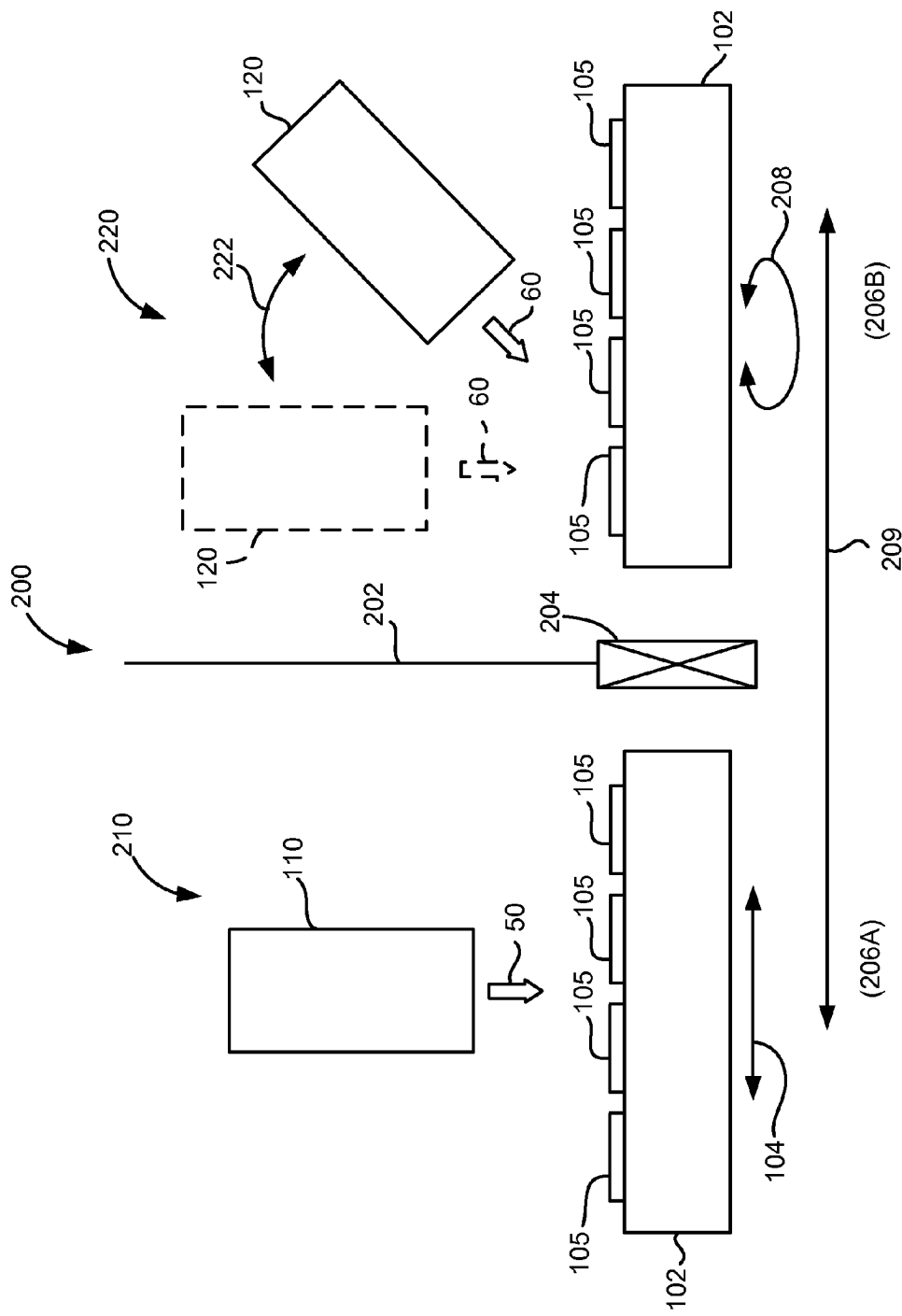
FIG. 5 is a schematic illustration of another embodiment of an apparatus for patterning patterned media.

As shown in FIG. 5, one embodiment of an apparatus 200 for patterning patterned media 105 implants ions in the patterned media 105 and deposits new mask material onto the patterned media in serial steps as discussed above. The apparatus 200 also includes a platen 102 for supporting one or more media 105. The platen 102 is movable between two partitioned sub-chambers 210, 220 of a main sealed chamber. The sub-chambers 210, 220 are partitioned by a partition 202, which can be a non-permeable wall or screen. The partition 202 may include a gate or valve 204 that is selectively actuatable to allow the platen 102 to move through the partition as indicated by directional arrows 209. For example, the gate 204 may sealingly cover an opening in the partition 202 in a closed position and move away from, expose, and allow access through the opening in an open position.

Similar to the apparatus 100, the apparatus 200 includes at least one ion source 110 and at least one new mask material source 120 for producing and directing ions 50 and new mask material 60, respectively, at the patterned media 105 on the platen 102. The ion source 110 is positioned within or coupled to the first sub-chamber 210, and the new mask material source 120 is positioned within or coupled to the second sub-chamber 220. In the illustrated embodiment, the ion source 110 is configured to direct ions 50 toward the media 105 at a normal incidence angle relative to a top surface of the media. In other embodiments, the ion source 110 may be configured to direct ions 50 toward the media at an incidence angle less than normal. The new mask material source 120 can be configured to direct new mask material 60 toward the media 105 at a normal incidence angle or an incidence angle less than normal relative to the top surface of the media. In some implementations, the new mask material source 120 is adjustable to adjust the incidence angle as desired as shown by directional arrows 222. In one implementation, the incidence angle of the new mask material source 120 is adjustable in situ during a new mask material deposition process. In yet other implementations, the new mask material source 120 is fixed to direct mask material 60 at an angle of incidence that is either normal or less than normal.

The apparatus 200 transitions between operation in an ion implantation mode 206A and a new mask material deposition mode 206B. In the ion implantation mode 206A, the platen 102 and media 105 are positioned within the first sub-chamber 210. Contrastingly, in the new mask material deposition mode 206B, the platen 102 and media 105 are positioned within the second sub-chamber 220. During operation in the ion implantation mode 206A, the ion source 110 implants ions 50 into a patterned layer of the patterned media 105 as discussed above. If desirable, the ions 50 can be formed into an ion beam and the platen 102 can be moved translationally or laterally such that the ion beam passes over each of the media 10. During operation in the new mask material mode 206B, the new mask material source 120 deposits a new mask material 60 onto a depleted hard mask on the media 105 as discussed above. In some implementations, the new mask material 60 is projected as a stream and the platen 102 can be moved such that the stream of new mask material passes over each of the media. In one implementation, the platen 102 moved translationally or laterally. In other implementations, such as when the incidence angle of the new mask material stream 60 is less than normal, the platen 102 can be rotated as indicated by directional arrows 208 to more evenly distribute the new mask material onto the media 105.

As mentioned above, the transition between operation in the ion implantation and new mask material deposition modes 206A, 206B is facilitated by actuation of the gate 204 to allow the platen 102 to be moved between the first and second sub-chambers 210, 220 as indicated by directional arrows 209. For example, after an ion implantation process in the first sub-chamber 210 is complete, the gate 204 can be opened, the platen 102 can be moved through the opened gate into the second sub-chamber 220 in anticipation of a new mask material deposition process in the second sub-chamber 220, and the gate can be closed. Following the deposition process, the gate 204 can again be opened, the platen 102 can be moved through the opened gate back into the first sub-chamber 210 in anticipation of a second ion implantation process, and the gate can be closed. In this manner, the apparatus 200 can be selectively operable between the implantation and deposition modes 206A, 206B as many times as necessary to complete the patterning of the patterned media 105.

Figure 6:
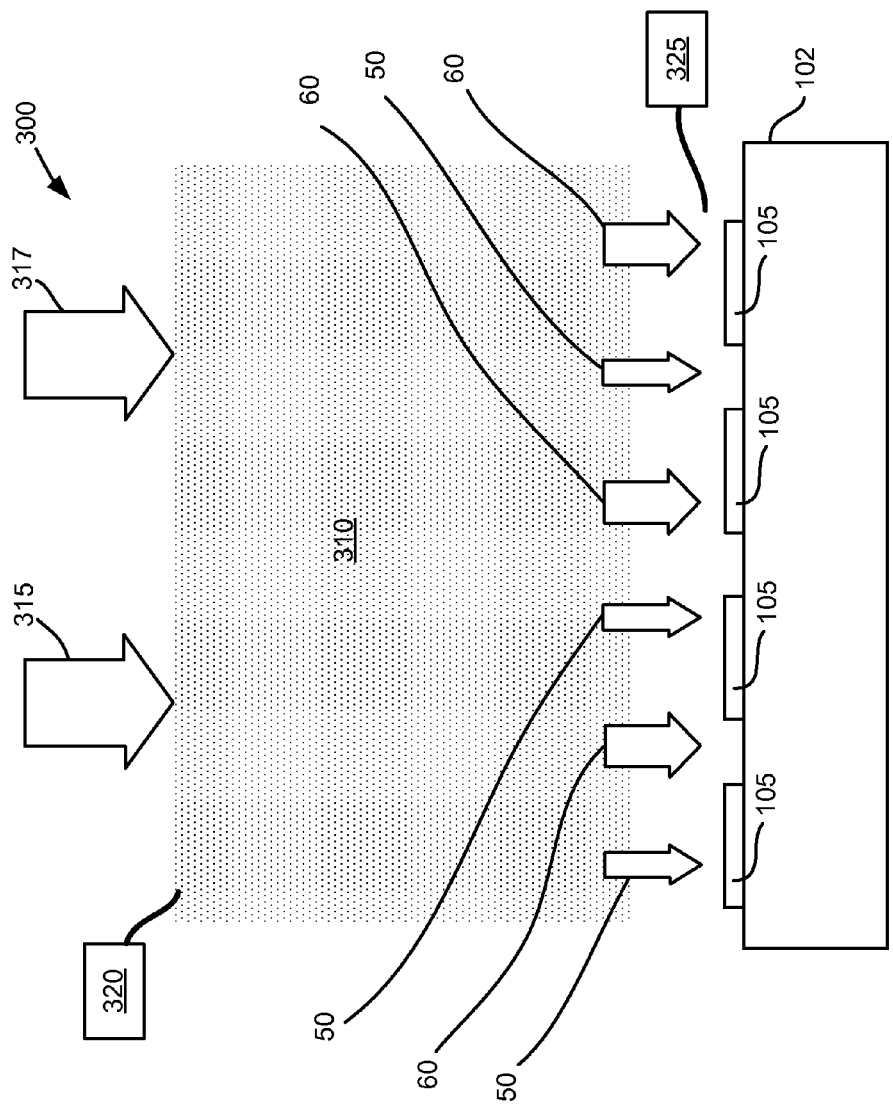
FIG. 6 is a schematic illustration of an embodiment of an apparatus for patterning patterned media using a plasma medium.
Figure 7:
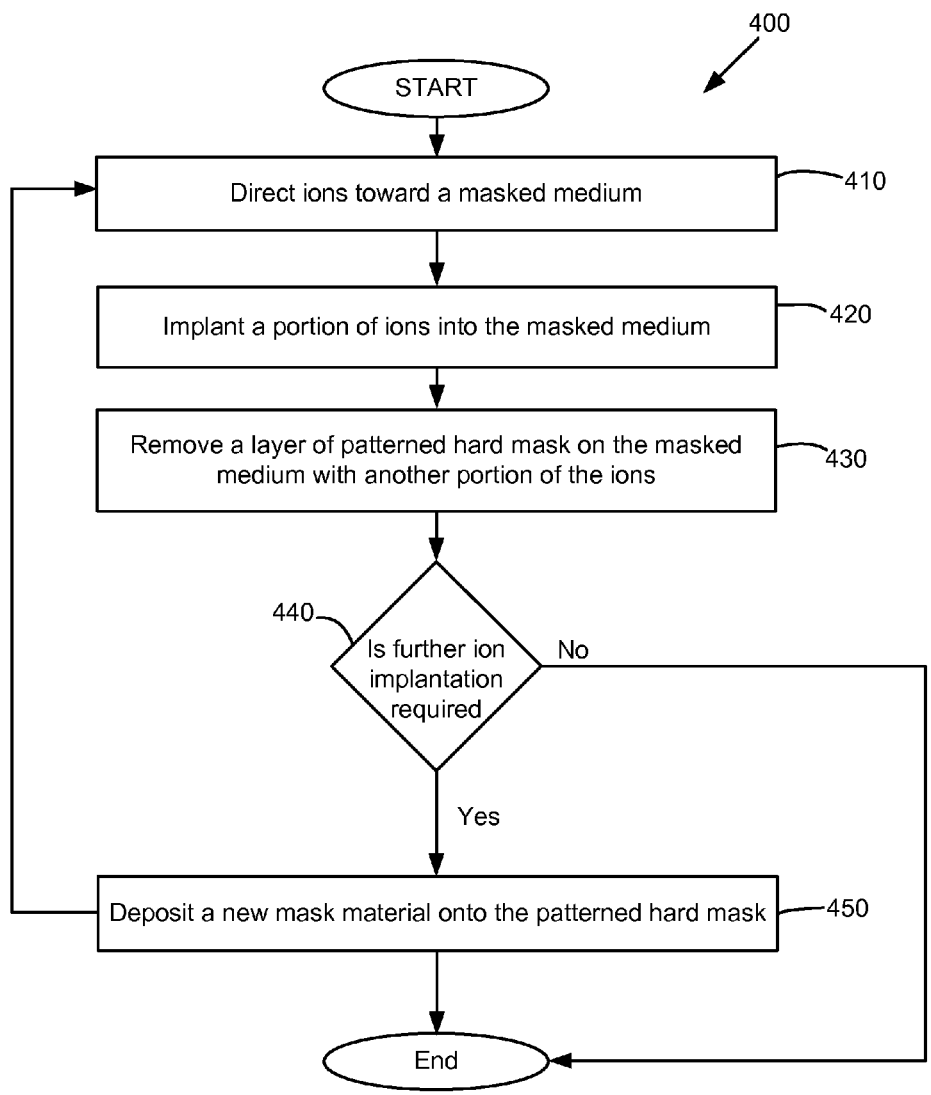
FIG. 7 is a flow diagram illustrating a method for patterning a patterned medium.

According to an alternative embodiment for patterning patterned media shown in FIG. 6, an apparatus 300 employs plasma implantation techniques (e.g., plasma assisted doping and plasma immersion ion implantation) to implant ions into the media and deposit new mask material onto the media. Generally, the apparatus 300 is selectively operable between a plasma-assisted implantation mode for implanting ions into the patterned media 105 and a plasma-assisted deposition mode for depositing new mask material onto a depleted hard mask on the patterned media. In both modes, an ion-containing plasma medium 310 is generated in a sealed chamber.

The apparatus 300 is coupled to an ion source and a new mask material source that are operable to introduce an ion gas 315 and a new mask material gas 317, respectively, into the sealed chamber. Further, when introduced into the chamber, the gases 315, 317 are respectively coupled in power receiving communication with a power source 320 (e.g., an RF power supply) for energizing the gases to create the plasma medium 310 within the chamber. An additional power supply 325 is coupled in power providing communication with the plasma 310 to apply an acceleration voltage to the plasma medium 310 that controls the energy of the ions 50 or new mask material 60 within the plasma medium 310. The voltage applied to the ions 50 or new mask material 60 is sufficient to increase the energy of the ions and material to a level that is adequate for implantation of the ion species 315 into the patterned media 105 or deposition of the mask material species 317 onto the patterned media (e.g., a depleted hard mask applied to a patterned layer of the patterned media). Generally, the energy required to implant ions is higher than the energy to deposit mask material. Accordingly, the plasma chemistry (e.g., ion or mask material energy) is adjustable by changing the voltage applied to the plasma to accommodate alternating use of the sealed chamber for ion implantation and hard mask deposition.

In operation, the apparatus 300 transitions between an ion implantation mode and a new mask material deposition mode. In the ion implantation mode, the ion source introduces the gas with the desired ions 315 into the chamber, a ion plasma medium 310 is created using the first power supply 320 and a first voltage is applied to the medium using the second power supply 325. The first voltage corresponds with the energy necessary to implant the ion species 315 into the patterned media 105. Accordingly, the first voltage may vary depending on the particular type of ion species introduced into the plasma medium 310. For example, the first voltage may be lower for high-density ions and higher for low-density ions. After being energized by the second power supply 325, the ions 50 implant into regions of reduced magnetism within the patterned media 105 as described in detail above.

The plasma-assisted ion implantation process tends to reduce the thickness of hard masks applied onto the magnetic media in the same manner as the ion beam ion implantation processes. Accordingly, following an ion implantation procedure in the ion implantation mode, the apparatus 300 switches into the new mask material deposition mode to renew the lost hard mask material.

According to one embodiment where the ion species is different than the new mask material species, transitioning from the ion implantation mode to the new mask material deposition mode includes vacating the chamber and introducing process gas, or gasses into the chamber. For example, acetylene or ethylene could be used in the case of carbon deposition. The first power supply 320 then applies an AC, or DC, voltage to the chamber to generate a plasma with the process gas. A second or bias voltage (e.g., less than 100V) is applied between the plasma and the substrate using the second power supply 325 to assist in the material deposition process. The new mask material 60 deposits onto the depleted hard mask applied to the patterned media 105 as described in detail above. The apparatus 300 then switches operation back to the ion implantation mode from the mask material deposition mode, and again implants ions into the media 10 using the above-described procedure. Although in the schematic illustrations, the energized ions 50 and new mask material species 60 are depicted using a plurality of spaced-apart arrows, the energized ions and mask material species are not introduced as discrete, localized, and spaced-apart groups of energized ions and mask material species. Rather, the energized ions 50 and new mask material species 60 are introduced relatively uniformly across the entire platen 102 and media 10.

Operation of the above-described apparatus may be controlled by a control module. The control module can be configured to control each ion implantation, mask material deposition, and/or combination ion implantation and material deposition processes. For example, based on the hard mask material, ion species, and new mask material species used, the control module may determine and implement the timing of the processes (e.g., the start time and duration of each process), the status of the patterned media (e.g., the thickness of the hard mask and thickness of the removed layer), the necessary voltages for the plasma-assisted processes, the platen position control, the gate control for partitioned chamber applications, and any other controllable aspects of the apparatus.

Some of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

The schematic flow chart diagrams and method schematic diagrams described above are generally set forth as logical flow chart diagrams. As such, the depicted order and labeled steps are indicative of representative embodiments. Other steps and methods may be conceived that are equivalent in function, logic, or effect to one or more steps, or portions thereof, of the methods illustrated in the schematic diagrams. Additionally, the format and symbols employed are provided to explain the logical steps of the schematic diagrams and are understood not to limit the scope of the methods illustrated by the diagrams. Although various arrow types and line types may be employed in the schematic diagrams, they are understood not to limit the scope of the corresponding methods. Indeed, some arrows or other connectors may be used to indicate only the logical flow of a method. For instance, an arrow may indicate a waiting or monitoring period of unspecified duration between enumerated steps of a depicted method. Additionally, the order in which a particular method occurs may or may not strictly adhere to the order of the corresponding steps shown.

The present subject matter may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for patterning a medium having a patterned hard mask applied thereon, the patterned hard mark including a plurality of apertures exposing portions of the medium, comprising:
   directing ions toward the medium;
   implanting a portion of the ions into the exposed portions of the medium;
   removing a layer of the patterned hard mask with another portion of the ions; and
   depositing hard mask material onto the patterned hard mask.

2. The method of claim 1, further comprising depositing hard mask material onto the exposed portions of the medium following implantation of the portion of the ions into the exposed portions of the medium.

3. The method of claim 2, further comprising directing hard mask material toward the medium, wherein depositing hard mask material onto the patterned hard mask comprises depositing a first portion of the directed hard mask material onto the patterned hard mask, and depositing hard mask material onto the exposed portions of the medium comprises depositing a second portion of the directed hard mask material onto the exposed portions of the medium.

4. The method of claim 1, wherein the hard mask material is deposited at an acute angle relative to an outer surface of the patterned hard mask onto which the hard mask material is deposited.

5. The method of claim 4, wherein the plurality of apertures are defined by a plurality of sidewalls formed in the patterned hard mask, and wherein depositing hard mask material onto the patterned hard mask comprises depositing a layer of hard mask material onto a top surface of the patterned hard mask and a portion of the sidewalls defining the plurality of apertures.

6. The method of claim 4, wherein the acute angle is between thirty and eighty degrees.

7. The method of claim 1, wherein the medium comprises a magnetic layer, the implanted ions altering the magnetic properties of the exposed portions of the magnetic layer to form a plurality of non-magnetic regions corresponding with the plurality of apertures of the patterned hard mask.

8. The method of claim 7, wherein the magnetic layer and the hard mask are formed on a substantially cylindrical substrate.

9. The method of claim 7, wherein the magnetic layer and the hard mask are formed on a flexible tape substrate.

10. The method of claim 7, wherein the medium comprises a magnetic medium of a magnetic memory device.

11. The method of claim 10, wherein the magnetic memory device comprises a hard disk drive.

12. The method of claim 1, wherein the medium has an initial set of electrical properties, and the implanted ions alter the electrical properties of the exposed portions of the medium to form a plurality of regions with different electrical properties corresponding with the plurality of apertures of the patterned hard mask.

13. The method of claim 12, wherein the electrical properties of the medium are different in unexposed portions and the exposed portions of the medium following implanting of the portion of the ions into the exposed portions of the medium.

14. The method of claim 13, wherein the medium comprises a semiconductor material.

15. The method of claim 1, wherein directing ions toward the medium comprises directing an ion-beam toward the medium, the method further comprising laterally moving the medium relative to the ion-beam while implanting the portion of the ions into the exposed portions of the medium.

16. The method of claim 1, further comprising rotating the medium while depositing the hard mask material onto the patterned hard mask.

17. The method of claim 1, wherein directing ions toward the medium, implanting the portion of the ions into the medium, removing the layer of the patterned hard mask, and depositing hard mask material onto the patterned hard mask occur concurrently.

18. The method of claim 1, wherein depositing hard mask material onto the patterned hard mask occurs after removal of the layer of the patterned hard mask.

19. The method of claim 1, wherein directing ions toward the medium comprises exposing the medium to a first plasma comprising the ions.

20. The method of claim 19, wherein depositing hard mask material onto the patterned hard mask comprises exposing the medium to a second plasma comprising the hard mask material.

21. The method of claim 20, wherein the ions of the first plasma comprise a first species and the first plasma comprises a high-voltage plasma, and wherein the hard mask material comprises a second species and the second plasma comprises a low-voltage plasma.

22. The method of claim 21, wherein the first species is substantially the same as the second species.

23. The method of claim 21, wherein the first species is different than the second species.

24. A method for patterning features in a magnetic layer on a medium, the features having different magnetic properties than the magnetic layer, the magnetic layer being coated with a patterned hard mask having a plurality of apertures exposing portions of the magnetic layer, comprising:
    exposing the patterned hard mask and magnetic layer to energetic ions, a first portion of the ions being implanted into the exposed portions of the magnetic layer to render the exposed portions less magnetic, and a second portion of ions etch removing a top layer of the patterned hard mask; and
    depositing a hard mask material onto the patterned hard mask to replace the etch removed top layer of the patterned hard mask.

25. The method of claim 24, wherein exposing the patterned hard mask and magnetic layer to energetic ions comprises a first step of exposing the patterned hard mask and magnetic layer to energetic ions, and depositing a hard mask material onto the patterned hard mask to replace the etch removed top layer of the patterned hard mask comprises a first step of depositing a hard mask material onto the patterned hard mask, the method further comprising a second step of exposing the patterned hard mask and magnetic layer to energetic ions following the first step of exposing the patterned hard mask and magnetic layer to energetic ions and the first step of depositing a hard mask material onto the patterned hard mask, and further comprising a second step of depositing a hard mask material onto the patterned hard mask to replace at least some of the deposited hard mask material etched removed by the second step of exposing the patterned hard mask and magnetic layer to energetic ions.

26. The method of claim 24, wherein exposing the patterned hard mask and magnetic layer to energetic ions occurs in a first chamber, and depositing the hard mask material onto the patterned hard mask occurs in a second chamber separate from the first chamber.

* * * * *